US007690358B2

(12) United States Patent
Lederle et al.

(10) Patent No.: US 7,690,358 B2
(45) Date of Patent: Apr. 6, 2010

(54) METHOD AND DEVICE FOR CONTROLLING A VALVE

(75) Inventors: Reiner Lederle, München (DE); Richard Pirkl, Regensburg (DE); Hans-Jörg Wiehoff, Regensburg (DE)

(73) Assignee: Continental Automotive GmbH, Hannover (DE)

( * ) Notice: Subject to any disclaimer, the term of this patent is extended or adjusted under 35 U.S.C. 154(b) by 494 days.

(21) Appl. No.: 11/570,016

(22) PCT Filed: May 27, 2005

(86) PCT No.: PCT/EP2005/005699

§ 371 (c)(1), (2), (4) Date: Dec. 4, 2006

(87) PCT Pub. No.: WO2005/119039

PCT Pub. Date: Dec. 15, 2005

(65) Prior Publication Data

US 2008/0000439 A1 Jan. 3, 2008

(30) Foreign Application Priority Data

Jun. 4, 2004 (DE) ....................... 10 2004 027 291

(51) Int. Cl.
*F02M 37/04* (2006.01)
*H01L 41/00* (2006.01)
*H02N 2/00* (2006.01)

(52) U.S. Cl. ................................. 123/498; 310/316.01

(58) Field of Classification Search ................. 123/467, 123/472, 478, 480, 490, 498; 239/88–96, 239/585.1–585.5; 310/316.01–317; 361/139–210; 701/103–105

See application file for complete search history.

(56) References Cited

U.S. PATENT DOCUMENTS 5,053,668 A * 10/1991 Mitsuyasu .................. 310/317

(Continued)

FOREIGN PATENT DOCUMENTS

DE 196 52 801 C1 4/1998

(Continued)

OTHER PUBLICATIONS

International Search Report with Written Opinion PCT/EP2005/005699, 8 pages, Aug. 19, 2005.

(Continued)

*Primary Examiner*—Stephen K Cronin
*Assistant Examiner*—David Hamaoui
(74) *Attorney, Agent, or Firm*—King & Spalding L.L.P.

(57) ABSTRACT

An piezo actuator loading signal is determined and generated according to an output value and a pilot control value which depends on at least one operational parameter. The loading signal causes that a valve member moves into a valve seat. A first value characteristic of the electric power fed to the actuator when the valve member hits the valve seat is determined while a second value characteristic of the energy delivered to the actuator is determined when the loading process of the actuator has been completed. A real value characteristic of a sealing force with which the valve member is pressed onto the valve seat is determined according to the first and second value. The real value and a predefined setpoint value are fed to the controller which accordingly adjusts a pilot control value assignment instruction which is used for determining the pilot control value if a predefined condition is met.

8 Claims, 2 Drawing Sheets

U.S. PATENT DOCUMENTS

| | | | | |
|---|---|---|---|---|
| 5,057,734 | A * | 10/1991 | Tsuzuki et al. | 310/317 |
| 6,121,715 | A | 9/2000 | Hoffmann et al. | 310/316.03 |
| 6,240,905 | B1 | 6/2001 | Boecking | 123/498 |
| 6,584,958 | B2 * | 7/2003 | Rahardja et al. | 123/467 |
| 6,766,761 | B1 * | 7/2004 | Tamez et al. | 116/205 |
| 7,275,522 | B2 * | 10/2007 | Beilharz et al. | 123/490 |
| 2003/0062027 | A1 | 4/2003 | Joos et al. | 123/478 |
| 2004/0255910 | A1 | 12/2004 | Joos et al. | 123/490 |
| 2006/0289670 | A1 | 12/2006 | Beilharz et al. | 239/88 |

FOREIGN PATENT DOCUMENTS

| | | | |
|---|---|---|---|
| DE | 198 35 494 | A1 | 2/2000 |
| DE | 198 35 494 | C2 | 6/2000 |
| DE | 103 59 675 | B3 | 7/2005 |
| WO | WO03/0081007 | A1 | 10/2003 |
| WO | WO03/0104633 | A1 | 12/2003 |

OTHER PUBLICATIONS

International Search Report PCT/EP2005/005699, 4 pages, Aug. 19, 2005.

Written Opinion Supplementary Sheet PCT/EP2005/005699, 2 pages.

* cited by examiner

METHOD AND DEVICE FOR CONTROLLING A VALVE

CROSS-REFERENCE TO RELATED APPLICATIONS

This application is a U.S. national stage application of International Application No. PCT/EP2005/005699 filed May 27, 2005, which designates the United States of America, and claims priority to German application number DE 10 2004 027 291.3 filed Jun. 4, 2004 the contents of which are hereby incorporated by reference in their entirety.

TECHNICAL FIELD

The invention relates to a method and device for controlling a valve. The valve has a valve drive, which is configured as a piezoactuator, a valve member, a valve body and a valve seat.

BACKGROUND

Such a valve is used for example in a pump/nozzle device for supplying fuel to the combustion chamber of a cylinder of an internal combustion engine, in particular a diesel internal combustion engine. In the case of a pump/nozzle device a pump, a control unit with the valve and a nozzle unit form an assembly. A pump piston is preferably driven by way of a camshaft of an internal combustion engine by means of a toggle.

The pump can be coupled hydraulically to a low-pressure fuel supply facility by way of the valve. It is coupled hydraulically to the nozzle unit on the output side. The start of injection and the quantity injected are determined by the valve and its valve drive. The compact structure of the pump/nozzle device results in a very small high-pressure volume and a large degree of hydraulic rigidity. This allows very high injection pressures of around 2,000 bar to be achieved. This high injection pressure combined with the ease of control of the start of injection and the quantity injected allows a significant emissions reduction whilst at the same time keeping fuel consumption low when the internal combustion engines are in use.

A pump/nozzle device is known from DE 198 35 494 C2 having a pump and a valve with a valve member, which controls the hydraulic coupling of a shut-off chamber to a run-off channel. The run-off channel is coupled hydraulically to the pump and a nozzle unit. A supply channel is provided, which is coupled hydraulically to the shut-off chamber. A piezoelectric valve drive is assigned to the valve member, by way of which the valve member can be moved between two end positions. In a first end position of the valve member the run-off channel is coupled hydraulically to a shut-off chamber and this in turn is coupled to the supply channel. In a second end position of the valve member the run-off channel is decoupled hydraulically from the shut-off chamber and the valve member is in a valve seat of the valve.

In the first end position of the valve member, during a delivery stroke of the pump, fluid is taken in by the pump from the supply channel by way of the shut-off chamber and the run-off channel. During a working stroke of a pump piston of the pump, in the first end position of the valve member, fluid is pushed back from the pump by way of the run-off channel, the shut-off chamber into the supply channel. In the second end position of the valve member, during the delivery stroke of the pump piston, the absence of any hydraulic coupling between the run-off channel and the shut-off chamber and the supply channel means that no fluid is pushed back and the pump piston generates high pressure. When a predetermined pressure threshold is exceeded, a nozzle needle of the nozzle unit opens a nozzle of the nozzle unit and fluid is injected. The end of injection is determined in that the valve member is controlled by means of the actuator unit into its first end position such that fluid can flow back by way of the run-off channel into the shut-off chamber and the supply channel, with the result that the pressure in the pump and therefore also in the nozzle unit drops, which in turn causes the nozzle unit to close.

Low pollutant emissions of an internal combustion engine, in which the pump/nozzle device is disposed, a precise control of the internal combustion engine require the precise measuring in of fuel by the pump/nozzle device. This in turn requires reproducible activation of the piezocontrolled valve of the pump/nozzle device, said activation having long-term stability.

SUMMARY

The object of the invention is to create a method and device for controlling a valve, by means of which it is possible to ensure precise control of the valve over a long operating period.

A method for controlling a valve with a valve drive, which is configured as a piezoactuator, with a valve member, a valve body and a valve seat, may comprise the steps of: determining and generating an actuating signal to load the piezoactuator such that the valve member is controlled from a position away from the valve seat into the valve seat, as a function of a pilot control value, which is a function of at least one operating variable, and an output value of a regulator; determining a first value, which is characteristic of the electrical energy supplied to the piezoactuator on arrival of the valve member on the valve seat; determining a second value, which is characteristic of the electrical energy supplied to the piezoactuator on completion of the loading process of the piezoactuator; determining an actual value, which is characteristic of a sealing force, with which the valve member is pressed onto the valve seat as a function of the first and second values; supplying the actual value and a predetermined setpoint value to the regulator, which generates the output value as a function thereof, and adjusting a pilot control value assignment instruction as a function of the output value and at least one operating variable and, when a predetermined condition is met, the pilot control value assignment instruction is used to determine the pilot control value.

In an embodiment, a basic pilot control value can be determined as a function of the at least one operating variable, an adaptation value can be determined as a function of the at least one operating variable, the pilot control value can be determined as a function of the basic pilot control value and the adaptation value and an adaptation value assignment instruction can be adjusted as a function of the output value and at least one operating variable and, when the predetermined condition is met, the adaptation value assignment instruction can be used to determine the adaptation value. In an embodiment, the predetermined condition can be configured such that it is met, when operation resumes after a break in the operation of the valve. In an embodiment, the pilot control value assignment instruction can be adjusted as a function of the output value and a rotation speed of a crankshaft of an internal combustion engine.

In another embodiment, a device for controlling a valve comprises a valve drive, which is configured as a piezoactuator, with a valve member, a valve body and a valve seat, wherein the device being operable to determine and generate an actuating signal to load the piezoactuator, such that the valve member is controlled from a position away from the valve seat into the valve seat, as a function of a pilot control value, which is a function of at least one operating variable, and an output value of a regulator, determine a first value, which is characteristic of the electrical energy supplied to the piezoactuator on arrival of the valve member on the valve seat, determine a second value, which is characteristic of the electrical energy supplied to the piezoactuator on completion of the loading process of the piezoactuator, determine an actual value, which is characteristic of a sealing force, with which the valve member is pressed onto the valve seat, as a function of the first and second values, supply the actual value and the predetermined setpoint value to the regulator, which generates the output value as a function thereof, and adjust a pilot control value assignment instruction as a function of the output value and at least one operating variable and, when a predetermined condition is met, use the pilot control value assignment instruction to determine the pilot control value.

BRIEF DESCRIPTION OF THE DRAWINGS

Exemplary embodiments of the invention are described in more detail below based on the schematic drawings, in which.

Elements with the same structure or function are shown with the same reference characters in all the figures.

DETAILED DESCRIPTION

Figure 1:
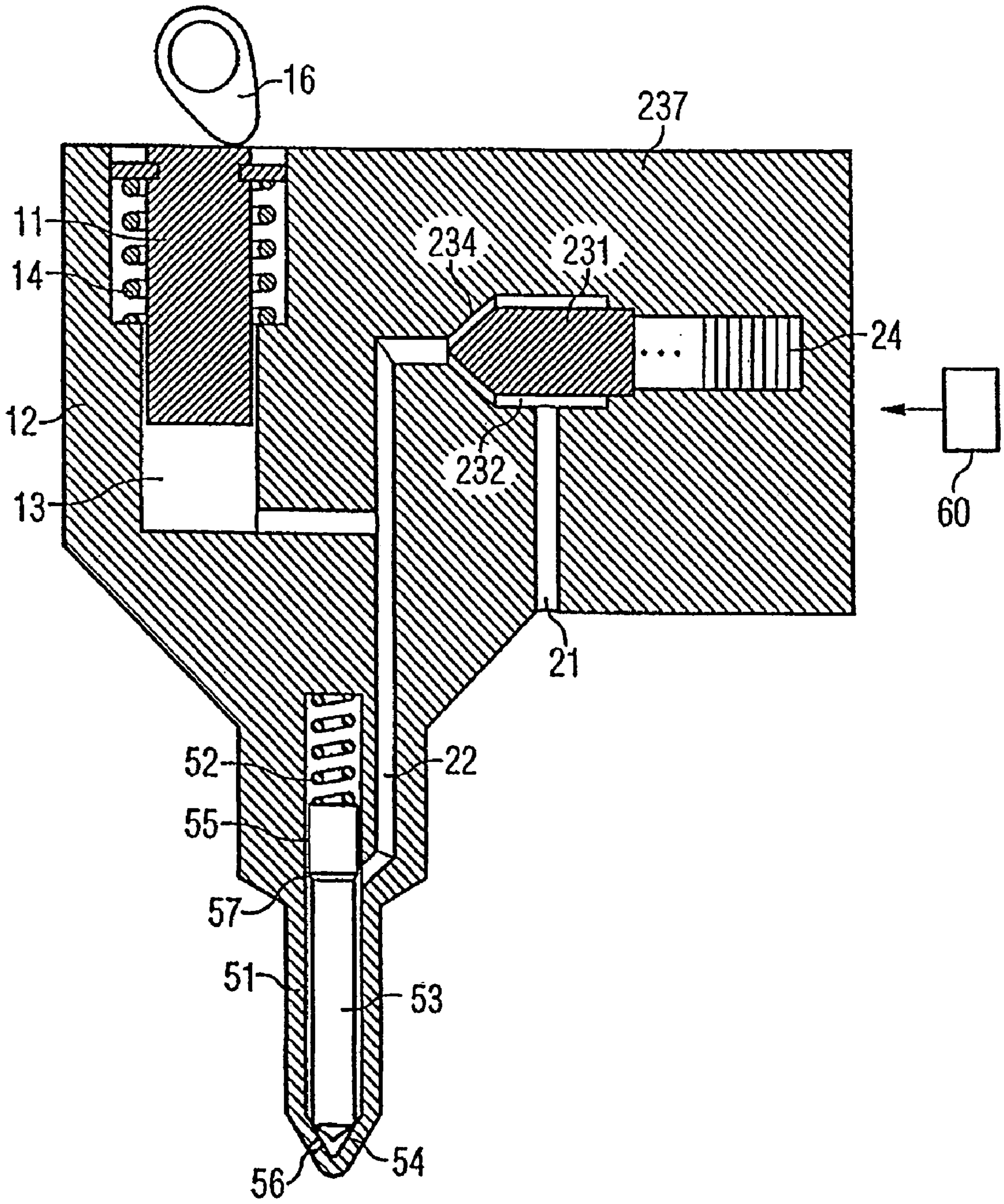
FIG. 1 shows a pump/nozzle device with a valve and a device for controlling the pump/nozzle device and the valve and FIG. 2 shows a block diagram for determining an actuating signal in the device for controlling the valve.

In a method and a corresponding device for controlling a valve, a valve drive can be configured as a piezoactuator, with a valve member, a valve body and a valve seat. An actuating signal to load the piezoactuator is determined and generated as a function of a pilot control value and an output value of a regulator. The pilot control value is a function of at least one operating variable. The actuating signal is used to load the piezoactuator such that the valve member is controlled from a position away from the valve seat into the valve seat. A first value is determined, which is characteristic of the electrical energy supplied to the piezoactuator, as the valve member arrives on the valve seat. A second value is determined, which is characteristic of the electrical energy supplied to the piezoactuator, when the process of loading the piezoactuator is completed. An actual value, which is characteristic of a sealing force, with which the valve member is pressed on the valve seat, is determined as a function of the first and second values. The actual value and a predeterminable setpoint value are supplied to the regulator, which generates an output value as a function thereof. A pilot control value assignment instruction is adjusted as a function of the output value and at least one operating variable. When a predetermined condition is met, the pilot control value assignment instruction is used to determine the pilot control value.

Therefore precise activation is simple to achieve even with highly dynamic activation of the valve, as is particularly the case when the valve is used for a pump/nozzle device, as the correspondingly adjusted pilot control value assignment instruction relieves the burden on the regulator and said regulator only has to compensate for minor deviations around the operating point, with the result that such deviations can be compensated for quickly. It is also possible in this manner to adjust the sealing force of the valve precisely over a long operating period of the valve. The pilot control value assignment instruction here refers to the formula used to determine the pilot control value as a function of the at least one operating variable. It can for example be converted by means of a corresponding analytical function but is reproduced particularly simply by means of a suitable characteristic map.

The valve force, with which the valve is pushed into the valve seat by the valve drive, can be adjusted in a manner that is very exact and can be reproduced very easily, when it is in contact with the valve seat. The valve seat force is indicative of the degree of sealing of the valve, when the valve member is in contact with the valve seat. This allows the mechanical strain of the valve member and also the valve seat to be reduced specifically over a long operating period of the valve and at the same time ensures that the valve seat force, in other words the sealing force, remains the same over said long operating period. It is therefore also possible to minimize tolerances during the opening and closing process of the valve in a simple manner.

The embodiments therefore also utilize the knowledge that the first value is largely a function of a force, which is produced by the pressure of the fluid acting on the valve member, and a force of a regularly present reset means. The embodiments also utilize the knowledge that the second value is largely a function of the sealing force and also the force, which is produced by the pressure of the fluid acting on the valve, and the force of the reset means. An actual value for the sealing force can thus be determined in a simple manner as a function of the two values. The piezoactuator can therefore also be used as a sensor at the same time.

According to an embodiment a basic pilot control value is determined as a function of the at least one operating variable. An adaptation value is determined as a function of the at least one operating variable and an adaptation value assignment instruction is adjusted as a function of the output value and at least one operating variable and, if the predetermined condition is met, the adaptation value assignment instruction is used to determine the adaptation value. The pilot control value is determined as a function of the basic pilot control value and the adaptation value. It is possible in this manner, for example in the case of a number of valves, to determine the respective basic pilot control value by means of the same basic pilot control value assignment instruction, which in some instances does not even have to be adjusted, and it is simply possible to adjust to adapt the adaptation value assignment instruction individually for every valve. This then allows very precise activation of the individual valve and the basic pilot control value assignment instruction can be used in a common manner at the same time.

It may be particularly advantageous, if the predetermined condition is configured such that it is met when operation resumes after a break in the operation of the valve. A break in operation is characterized in that the valve member is not moved for a significantly longer period than is the case during typical operation of the valve. Where the valve is used in an internal combustion engine, such a break in operation can for example be the time period between the deactivation of the internal combustion engine and a subsequent engine start. It is possible thus to ensure in a simple manner that the largest possible number of output values are captured to adjust the pilot control value assignment instruction, before it is actually used to determine the pilot control value. This makes it possible to prevent unwanted coupling effects, in particular direct feedback effects. It also enhances the quality of the pilot control in a simple manner.

It may be particularly simple for the pilot control value assignment instruction to be a function of the output value and a rotation speed of a crankshaft of an internal combustion engine, when the valve is used in an internal combustion engine, for example in a pump/nozzle device. It has surprisingly proven in this context that sufficiently precise adjustment of the pilot control value assignment instruction is made possible by simply taking into account the rotation speed. In particular it is possible to take dynamic influences simply into account in this manner.

The pump/nozzle device (FIG. 1) comprises a pump unit, a control unit and a nozzle unit. The pump/nozzle device is preferably used to feed fuel into the combustion chamber of a cylinder of an internal combustion engine. The internal combustion engine is preferably configured as a diesel internal combustion engine. The internal combustion engine has an intake duct to take in air, it being possible to couple said intake duct to cylinders by means of gas inlet valves. The internal combustion engine also has an exhaust gas duct, which is controlled by way of the outlet valve to remove the gases to be ejected from the cylinders. The cylinders are respectively assigned pistons, which are coupled respectively to a crankshaft by way of a connecting rod. The crankshaft is coupled to a camshaft.

The pump unit comprises a piston 11, a pump body 12, a working space 13 and a pump reset means 14, which is preferably configured as a spring. When integrated in an internal combustion engine, the piston 11 is coupled to a camshaft 16, preferably by means of a toggle, and is driven by said camshaft 16. The piston 11 is guided in a recess of the pump body 12 and determines the volume of the working space 13 as a function of its position.

The pump reset means 14 is configured and disposed such that the volume of the working space 13 defined by the piston 11 has a maximum value, when no external forces are acting on the piston 11, in other words forces, which are transmitted by way of the coupling with the camshaft 16.

The nozzle unit comprises a nozzle body 51, in which a nozzle reset means 52, which is configured as a spring and in some instances also as a damping unit, and a nozzle needle 53 are disposed. The nozzle needle 53 is disposed in a recess of the nozzle body 51 and is guided in the region of a needle guide 55.

In a first state the nozzle needle 53 is in contact with a needle seat 54, thereby sealing a nozzle 56, which is provided to feed fuel into the combustion chamber of the cylinder of the internal combustion engine. The nozzle unit is preferably configured as an inward opening nozzle unit, as shown.

In a second state the nozzle needle 53 is disposed at a slight distance from the needle seat 54, towards the nozzle reset means 52, thereby releasing the nozzle 56. In this second state fuel is measured into the combustion chamber of the cylinder of the internal combustion engine. The first or second state is adopted as a function of a force balance between the force exerted by the nozzle reset means 52 on the nozzle needle 53 and the force countering this, produced by the hydraulic pressure in the region of the needle shoulder 57.

The control unit comprises a supply channel 21 and a run-off channel 22. The supply channel 21 and the run-off channel 22 can be coupled hydraulically by means of a valve. The supply channel 21 is guided to the valve by a low-pressure side connection of the pump/nozzle device. The run-off channel 22 is coupled hydraulically to the working space 13 and is guided to the needle shoulder 57 and can be coupled hydraulically to the nozzle 56 as a function of the current state of the nozzle needle 53.

The valve comprises a valve member 231, which is preferably configured as what is known as an A-valve, in other words it opens outward counter to the flow direction of the fluid. The valve also comprises a shut-off chamber 232, which is coupled hydraulically to the supply channel 21 and can be coupled hydraulically by means of the valve member 231 to a high-pressure chamber. The high-pressure chamber is coupled hydraulically to the run-off channel 22.

When the valve member 231 is in the closed position, the valve member 231 is in contact with a valve seat 234 of a valve body 237. A valve reset means is also provided, which is disposed and configured such that it pushes the valve member 231 into an open position, in other words at a distance from the valve seat 234, when the forces exerted by an actuating drive 24 on the valve member are smaller than the forces produced by the pressure of the fluid, in this instance the fuel, and acting on the valve member 231 by way of the valve reset means. The actuating drive 24 is configured as a piezostack.

The actuating drive 24 is preferably coupled by means of a transmission unit, which preferably amplifies the lift of the actuating drive 24, to the valve member 231. A connector is preferably also provided on the actuating drive 24 to receive electric contacts to activate the actuating drive 24.

A device 60 is provided to control the pump/nozzle device, generating an actuating signal SG for the valve.

With the valve member 231 in the open position, when the piston 11 is moved upward, in other words away from the nozzle 56, fuel is taken into the working space 13 by way of the supply channel 21. As long as the valve member 231 remains in its open position during a subsequent downward movement of the piston 11, in other words toward the nozzle 56, the fuel in the working space 13 and the run-off channel 22 is pushed back again into the shut-off chamber 232 and in some instances into the supply channel 21 by way of the valve.

If however the valve member 231 is controlled into its closed position during the downward movement of the piston 11, the fuel in the working space 13 and therefore also in the run-off channel 22 and in the high-pressure chamber is compressed, as a result of which the pressure in the working space 13, the high-pressure chamber and the run-off channel 22 increases as the piston 11 continues its downward movement. As the pressure in the run-off channel 22 rises, so does the force produced by the hydraulic pressure, said force acting on the needle shoulder 57 in the direction of an opening movement of the nozzle needle 53 to release the nozzle 56. When the pressure in the run-off channel 22 exceeds a value, at which the force produced on the needle shoulder 57 by the hydraulic pressure is greater than the force of the nozzle reset means 52 counter to this, the nozzle needle 53 moves away from the needle seat 54, thereby releasing the nozzle 56 for the supply of fuel to the cylinder of the internal combustion engine. The nozzle needle 53 then moves back into the needle seat 54, thereby sealing the nozzle 56, when the hydraulic pressure in the run-off channel 22 drops below the value, at which the force produced at the needle shoulder 57 by the hydraulic pressure is smaller than the force produced by the nozzle reset means 52. The time when the force drops below said value and fuel ceases to be measured in can be influenced by controlling the valve member 231 from its closed position to an open position.

Controlling the valve member from its closed position to its open position produces the hydraulic coupling between the high-pressure chamber and the shut-off chamber 232 and the supply channel 21. The large pressure difference between the fluid in the high-pressure chamber and the run-off channel 22 and the fluid in the shut-off chamber 232 and the supply channel 21 during the opening process causes the fuel to flow from the high-pressure chamber at very high speed, generally the speed of sound, into the shut-off chamber 232 and on into the supply channel 21. This then rapidly reduces the pressure in the high-pressure chamber and the run-off channel 22 so significantly that the forces exerted by the nozzle reset means 52 on the nozzle needle 53 cause the nozzle needle 53 to move into the needle seat 54, thereby sealing the nozzle 56.

Figure 2:
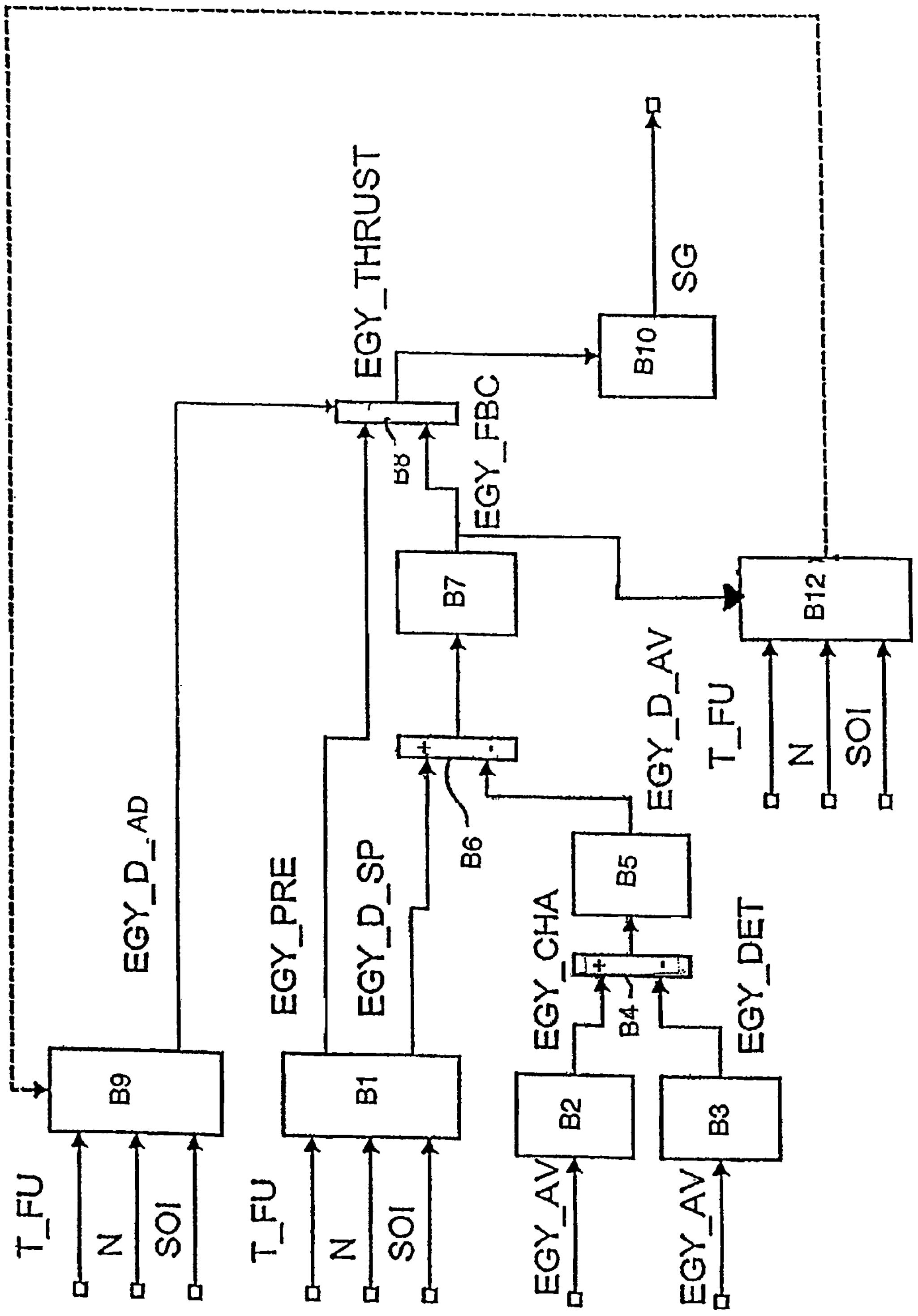

The process of determining an actuating signal SG to load the piezoactuator of the valve drive 24 is described below with reference to the block diagram in FIG. 2.

At a predeterminable first time the valve member 231 is controlled from its position away from the valve seat 234 into the valve seat. The predeterminable first time is preferably selected such that the piston 11 is in its top dead center and remains there until the anticipated arrival of the valve member 231 on the valve seat 234. This allows the arrival time to be detected particularly precisely. The predeterminable first time can however also be selected such that the piston 11 has left its top dead center by the anticipated arrival of the valve member 231 on the valve seat 234.

In a block B1 a basic pilot control value EGY_PRE of the electrical energy to be supplied is determined as a function of a fuel temperature T_FU and/or a rotation speed N and the predeterminable first time. The predeterminable first time is dependent on the time SOI when the nozzle needle 53 moves away from its contact with the nozzle body 51, in other words the start of injection, and, if the piston is partially outside its top dead center, while the valve member 231 is in contact with the valve seat 234. The pilot control value EGY_PRE of the electrical energy to be supplied is determined for example by means of a characteristic map, the characteristic map values of which were determined beforehand by experimentation.

A setpoint value EGY_D_SP of an electrical differential energy is also determined in the block B1. The setpoint value EGY_D_SP of the electrical differential energy is characteristic of the sealing force, exerted by the valve member 231 on the valve seat 234 of the valve body 237, when the valve member 231 is in contact with the valve seat 234. The setpoint value EGY_D_SP of the electrical differential energy is determined in the block B1 as a function of the fuel temperature T_FU, the speed N and/or the predeterminable first time. It can also be done by means of a corresponding characteristic map for example. Alternatively or additionally it can also be done as a function of a coolant temperature.

In a block B2 the energy supplied until the arrival of the valve member 231 on the valve seat 234 is determined as a function of actual values EGY_AV of the electrical energy supplied to the piezoactuator during the loading process. This can be done for example by evaluating actual values V_AV of the piezovoltage or corresponding variables characterizing it, for example the actual current through the piezoactuator or the load or electrical energy supplied to the piezoactuator. The arrival of the valve member 231 results in a characteristic pattern of said variables, which can be used to identify the time of arrival of the valve member 231. An actual value EGY_AV of the electrical energy supplied on arrival of the valve member 231 in the valve seat 234 is then also determined in the block B2 based on the determined time of arrival of the valve member 231 in the valve seat 234 and the actual value EGY_AV of the energy supplied assigned to this time.

In a block B3 the actual values EGY_AV of the electrical energy supplied are also read in and the actual value EGY_AV at the end of the loading process of the piezoactuator is assigned to an actual value EGY_CHA of the electrical energy supplied on completion of the loading process. Completion of the loading process can for example be identified when the actual values EGY_AV of the electrical energy supplied reach a maximum or by corresponding information to a further controller function for the pump/nozzle device.

In a block B4 the difference between the actual value EGY_CHA of the electrical energy supplied on completion of the loading process and the actual value EGY_DET of the supplied electrical energy on arrival of the valve member 231 in the valve seat 234 is determined and routed to a block B5, which comprises a low-pass filter and provides an actual value EGY_D_AV of the electrical differential energy at its output.

In a block B6 the difference is formed between the setpoint value EGY_D_SP and the actual value EGY_D_AV of the electrical differential energy. In a simpler embodiment the actual value EGY_D_AV of the electrical differential energy can also be determined directly without the low-pass filter in block B5.

The output of the block B6 is connected to the input side of a block B7, which comprises a regulator, which is preferably configured as a PI regulator. The manipulated variable of the regulator, which in this exemplary embodiment is a regulating value EGY_FBC of the electrical energy to be supplied, which can also be referred to as the output value, is then supplied to a block B8.

In a block B9 an adaptation value EGY_D_PRE of the electrical differential energy to be supplied is determined as a function of one or more of the following variables. The variables are for example the fuel temperature T_FU or the coolant temperature or the rotation speed or the time SOI of the start of injection.

To this end an adaptation value assignment instruction is stored in the block B9, said adaptation value assignment instruction being processed during operation of the valve to determine the adaptation value EGY_D_AD. To this end a characteristic map is preferably stored for every individual pump/nozzle device in the block B9, with values of the adaptation value EGY_D_AD being stored therein as a function of one or more input variables of the block B9. A predeterminable number of characteristic map points are preferably stored in said characteristic map. The respective adaptation value EGY_D_AD is then determined, as is usual with characteristic maps, by means of corresponding interpolation between the stored characteristic map points. The characteristic map of the block B9 is updated when a predetermined condition is present. The predetermined condition is preferably met, when the internal combustion engine, to which the pump/nozzle device is assigned, is restarted after the engine has stopped. The updating of the characteristic map is described in more detail below.

The adaptation value EGY_D_PRE of the electrical differential energy to be supplied and the basic pilot control value EGY_PRE of the electrical energy to be supplied are added together in the block B8 and thereby form a pilot control value of the electrical energy to be supplied. The regulating value EGY_FBC of the electrical energy to be supplied is also added in the block B8 and the resulting sum is the required electrical energy EGY_THRUST to be supplied to the piezoactuator.

The value EGY_THRUST of the required electrical energy to be supplied is fed to a block B10, in which a corresponding actuating signal SG is generated to activate the valve drive 24 configured as a piezoactuator. The actuating signal SG is preferably a pulse-width-modulated signal and the required electrical energy to be supplied EGY_THRUST is preferably split into a predetermined number of energy sub-quantities, each being supplied to the piezoactuator in a period of the pulse-width-modulated or pulse-amplitude-modulated signal.

The block B10 also preferably comprises a further lower-order regulator, in which the actual supply of electrical energy to the piezoactuator is regulated, with the manipulated variable being the respective pulse width or pulse height of the actuating signal SG. The current loading at the time or the actual values V_AV of the piezovoltage or the actual values EGY_AV of the electrical energy supplied for example can also serve as the manipulated variables.

If the actuating signal SG is to be determined for a loading process subsequent to a second predeterminable time, which can also be selected such that the piston 11 has left its top dead centre before the anticipated arrival of the valve member 231 on the valve seat 234, the regulating value EGY_FBC of the electrical energy to be supplied is preferably adopted from a loading process, which took place subsequent to the first predeterminable time. Only the basic pilot control value EGY_PRE of the electrical energy to be supplied and the adaptation value EGY_D_AD of the electrical energy to be supplied are then re-calculated. This has the advantage of reducing the computation load and, if the predeterminable first time is selected such that the piston 11 is at its top dead center and remains there until the anticipated arrival of the valve member 231 on the valve seat 234, the valve sealing force is then also set precisely for the predeterminable second time.

A block B12 is also provided, to which the regulating value EGY_FBC of the regulator of the block B7 is fed. The regulating value EGY_FBC of the electrical energy to be supplied is representative of an error of the pilot control value of the electrical energy to be supplied in the current operating point, which is determined by one or more of the variables fuel temperature T_FU, coolant temperature, rotation speed N, start of injection SOI.

The block B12 preferably comprises an intermediate characteristic map, which is re-initialized in each instance after the characteristic map of the block B9 has been updated. The regulating values EGY_FBC occurring during operation of the pump/nozzle device are stored in the intermediate characteristic map of the block B12. This takes place as a function of the respectively assigned current variables, in other words one or more of the input variables of the block B12.

The intermediate characteristic map preferably comprises a predetermined number of discrete points for storing the regulating value EGY_FBC. The corresponding characteristic map values can preferably be "learned" by way of a surface weighting, a filter or by means of similar methods. It is thus possible to take into account by means of the surface weighting method how far the current operating point is in each instance from a corresponding checkpoint of the intermediate characteristic map and the one or more checkpoints of the intermediate characteristic map are then updated with a corresponding weighting.

As far as determining the output variables of the blocks B9, B1, B12 is concerned, it can also be advantageous to take into account the current capacity of the piezoactuator as an input variable.

When the predetermined condition is met, in other words for example when the internal combustion engine is restarted after an engine stop, the characteristic map of the block B9 is updated by means of the intermediate characteristic map of the block B12. It is particularly advantageous in this context, if the intermediate characteristic map is smoothed beforehand by means of a suitable filter. In the simplest instance the checkpoints of the intermediate characteristic map are added to the corresponding checkpoints of the characteristic map B9. Alternatively this can also be done by means of a predeterminable weighting, etc.

The regulating values EGY_FBC occurring since the last update of the characteristic map B9, which are representative of an error of the pilot control value in the current operating point, are thus used effectively to improve the quality of the respective pilot control value. It is possible in this manner to restrict the regulator of the block B7 to compensating only for extremely small differences between the setpoint value EGY_D_SP and the actual value EGY_D_AV of the electrical differential energy, thus ensuring very precise activation of the actuating drive 24, which is the piezoactuator, even during extremely highly dynamic operation of the pump/nozzle device.

Because the characteristic map of the block B9 is only updated when the predetermined condition is met, it is possible to prevent undesirable direct feedback effects. Alternatively the predetermined condition can also be configured such that it is met after a predeterminable number of engine runs, for example two, three, four or five engine runs, or that it is met after a predeterminable operating period, for example five or ten operating hours.

Alternatively, instead of the adaptation value EGY_DAD, the updating of the assignment instruction there can take place directly in the block B1 as a function of the intermediate characteristic map of the block B12. In this instance the basic pilot control value EGY_PRE can also be identical to the pilot control value.

As an alternative the output variables of the blocks B1, B2, B3, B4, B5, B6, B7, B8, B9, B10 can also be corresponding electrical voltages or currents or loads. In the case of an internal combustion engine with a number of cylinders, to which a number of pump/nozzle devices are then assigned, it is particularly preferable for the block B1 to be implemented in an identical manner for all pump/nozzle devices, while the block B9 is then preferably provided in an individual manner for every individual pump/nozzle device.

What is claimed is:

1. A method for controlling a valve with a valve drive, which is configured as a piezoactuator, with a valve member, a valve body and a valve seat, the method comprising the steps of:

determining and generating an actuating signal to load the piezoactuator such that the valve member is controlled from a position away from the valve seat into the valve seat, as a function of a pilot control value, which is a function of at least one operating variable, and an output value of a regulator, determining a first value, which is characteristic of the electrical energy supplied to the piezoactuator on arrival of the valve member on the valve seat, determining a second value, which is characteristic of the electrical energy supplied to the piezoactuator on completion of the loading process of the piezoactuator, determining an actual value, which is characteristic of a sealing force, with which the valve member is pressed onto the valve seat as a function of the first and second values, supplying the actual value and a predetermined setpoint value to the regulator, which generates the output value as a function thereof, adjusting a pilot control value assignment instruction as a function of the output value and at least one operating variable and, when a predetermined condition is met, the pilot control value assignment instruction is used to determine the pilot control value.

2. The method according to claim 1, wherein a basic pilot control value is determined as a function of the at least one operating variable, an adaptation value is determined as a function of the at least one operating variable, the pilot control value is determined as a function of the basic pilot control value and the adaptation value and an adaptation value assignment instruction is adjusted as a function of the output value and at least one operating variable and, when the predetermined condition is met, the adaptation value assignment instruction is used to determine the adaptation value.

3. The method according to claim 1, wherein the predetermined condition is configured such that it is met, when operation resumes after a break in the operation of the valve.

4. The method according to claim 1, wherein the pilot control value assignment instruction is adjusted as a function of the output value and a rotation speed of a crankshaft of an internal combustion engine.

5. A device for controlling a valve comprising:

a valve drive, which is configured as a piezoactuator, with a valve member, a valve body and a valve seat, means for determining and generating an actuating signal to load the piezoactuator such that the valve member is controlled from a position away from the valve seat into the valve seat, as a function of a pilot control value, which is a function of at least one operating variable and an output value of a regulator, means for determining a first value, which is characteristic of the electrical energy supplied to the piezoactuator on arrival of the valve member on the valve seat, means for determining a second value, which is characteristic of the electrical energy supplied to the piezoactuator on completion of the loading process of the piezoactuator, means for determining an actual value, which is characteristic of a sealing force, with which the valve member is pressed onto the valve seat as a function of the first and second values, means for supplying the actual value and a predetermined setpoint value to the regulator, which generates the output value as a function thereof, and means for adjusting a pilot control value assignment instruction as a function of the output value and at least one operating variable and, when a predetermined condition is met, for using the pilot control value assignment instruction to determine the pilot control value.

6. The device according to claim 5, comprising means for determining a basic pilot control value as a function of the at least one operating variable, and for determining an adaptation value as a function of the at least one operating variable, wherein the pilot control value is determined as a function of the basic pilot control value and the adaptation value and an adaptation value assignment instruction is adjusted as a function of the output value and at least one operating variable and, when the predetermined condition is met, the adaptation value assignment instruction is used to determine the adaptation value.

7. The device according to claim 5, wherein the predetermined condition is configured such that it is met, when operation resumes after a break in the operation of the valve.

8. The device according to claim 5, wherein the pilot control value assignment instruction is adjusted as a function of the output value and a rotation speed of a crankshaft of an internal combustion engine.

* * * * *